United States Patent [19]

Taylor

[11] Patent Number: 4,760,284
[45] Date of Patent: Jul. 26, 1988

[54] PINCHOFF VOLTAGE GENERATOR

[75] Inventor: Stewart S. Taylor, Beaverton, Oreg.

[73] Assignee: TriQuint Semiconductor, Inc., Beaverton, Oreg.

[21] Appl. No.: 25,467

[22] Filed: Mar. 13, 1987

Related U.S. Application Data

[63] Continuation-in-part of Ser. No. 2,082, Jan. 12, 1987.

[51] Int. Cl.⁴ .................................................. H03K 3/01
[52] U.S. Cl. .................................. 307/296 R; 307/304; 307/491; 307/501
[58] Field of Search ................... 307/296 R, 297, 304, 307/491, 501; 330/288, 296

[56] References Cited

U.S. PATENT DOCUMENTS

| | | | |
|---|---|---|---|
| 4,096,430 | 6/1978 | Waldron | 307/297 |
| 4,451,744 | 5/1984 | Adam | 307/304 |
| 4,609,833 | 9/1986 | Guterman | 307/304 |

*Primary Examiner*—John Zazworsky
*Attorney, Agent, or Firm*—William S. Lovell; Alexander C. Johnson, Jr.

[57] ABSTRACT

In an integrated circuit, a reference voltage proportional to the pinchoff voltage of a field effect transistor is created by providing a current source, including a first depletion-mode FET, and a second depletion mode FET having a source connected to the drain of the first FET at an output node. The first and second FETs have their source and drain, respectively, connected to the first and second supply voltages, respectively, so that in operation, substantially equal currents flow through the two transistors. The FETs are biased to operate in saturation. Regarding the first FET, this current is equal to $I_{DSS}$ (defined as $I_D$ when $V_{GS}=0$) of the first FET ($I_{DSS1}$) and is not greater than, and usually less than, $I_{DSS}$ of the second FET ($I_{DSS2}$). The dimensions of the FETs are proportioned such that the gate-source voltage across the second FET substantially equals a constant times the pinchoff voltage.

26 Claims, 3 Drawing Sheets 4,760,284

PINCHOFF VOLTAGE GENERATOR

This is a continuation-in-part of my patent application entitled HIGH SPEED SUPPLY INDEPENDENT LEVEL SHIFTER, Ser. No. 002,082, filed Jan. 12, 1987.

BACKGROUND OF THE INVENTION

This invention relates generally to a method and circuit for establishing an operating point of a field effect transistor (FET) and more particularly to the design of FET integrated circuits. This invention is applicable to GaAsFET, and silicon MOSFET, JFET and MESFET integrated circuits.

All active circuits require an operating point be established to determine the operational characteristics of the active devices. In analog FET circuits, it is usually desirable to set the operating point of the transistor, i.e., the drain-to-source voltage $V_{DS}$, at a point above the knee, i.e., the saturation or high-gain region, as opposed to below the knee, i.e., the triode, ohmic or low-gain region.

This can be done by picking a drain-source voltage $V_{DS}$ much larger than needed. For many applications, this design strategy is satisfactory and it is widely used by designers. It can be undesirable to do so, however, in situations in which a limited power supply voltage is available or in which the circuit has many transistors in series. It becomes necessary to more accurately divide the available voltage among the transistors to assure that all of the transistors operate in saturation.

From the prior art literature and conventional practice, it appears that no one in the field of analog FET integrated circuit design has seriously considered picking the minimum drain-source voltage required, knowing how the transistors operate, so as to insure that the operating point is above the knee without having unnecessary excess voltage, and implemented such a circuit. Conventionally, designers make a crude approximation with voltage dividers, stacked diodes and the like, but typically get a larger drain-source voltage than is required.

Also, many prior biasing circuits have adverse temperature-dependent operating characteristics. Once an operating point is selected, it is desirable to have any temperature-dependent changes to be in a direction that would tend to keep the operating point above the knee. Many circuits change in the wrong direction. For example, it is desirable for the bias circuit that establishes the drain-source voltage $V_{DS}$ for an FET to increase $V_{DS}$ in a known way. This is because the pinchoff voltage of the transistor becomes more negative (its magnitude increases) as temperature increases. Unfortunately, if one uses a stack of diodes to set $V_{DS}$, the drain-source voltage becomes less negative with temperature. To deal with this problem, designers conventionally use a larger $V_{DS}$ with sufficient margin to maintain the operating point above the knee while accommodating temperature variations. This approach works in many situations, but has some problems and restricts the freedom to create some circuits that a designer might otherwise use.

Accordingly, a need remains for a better way to set the operating point of a field effect transistor, that provides sufficient but not excessive voltage reliably to operate the FET in saturation.

SUMMARY OF THE INVENTION

One object of the invention is to provide an improved design of biasing circuit for use in FET integrated circuits.

A second object is to set the operating point of the field effect transistor with the drain-source voltage as small as possible while still maintaining it above the knee of the operating characteristic curve of the device.

Another object is to set the operating point accurately and in such a way that the need for excess voltage to compensate for temperature variations is minimized.

Yet another object is to set the operating point by means which compensates for temperature variations so as to reduce the need for excess drain-to-source voltage.

A further object of the invention as aforementioned is to provide a biasing circuit which is capable of setting the operating point in close relation to the pinchoff voltage of the FET and has substantially the same temperature coefficient as the pinchoff voltage.

Fundamentally, the drain-source voltage required to maintain a field effect transistor in saturation is related to the pinchoff voltage of the transistor. My observations of that fact led me to create a circuit that could be used for biasing that would set $V_{DS}$ to be some multiple of the pinchoff voltage. Extending this concept, I recognized that it would be possible to use a fractional or multiple pinchoff voltage to set biasing circuits, reference voltages and in other applications. My invention, then, is a circuit and method of circuit design which creates and utilizes a fraction or multiple of a pinchoff voltage for biasing. The pinchoff voltage is defined, for purposes of this invention, as the extrapolated value of gate-source voltage $V_{GS}$ at which the drain current $I_D=0$ when the transistor is in saturation.

In accordance with the invention, a reference voltage proportional to the pinchoff voltage of a field effect transistor is created by providing a current source, including a first depletion-mode FET, and a second depletion-mode FET having a source connected to the drain of the first FET at an output node. The first and second FETs have their source and drain, respectively, connected to the first and second supply voltages, respectively, so that in operation, substantially equal currents flow through the two transistors. The FETs are biased to operate in saturation. Regarding the first FET, this current is equal to $I_{DSS}$ (defined as $I_D$ when $V_{GS}=0$) of the first FET ($I_{DSS1}$) and is not greater than, and usually less than, $I_{DSS}$ of the second FET ($I_{DSS2}$). The dimensions of the FETs are proportioned such that the gate-source voltage across the second FET substantially equals a constant times the pinchoff voltage. For most design situations, this requirement of substantial equality is met by design tolerances within ten percent. Greater accuracy can be obtained within the scope of the invention.

One way that this can be done is by recognizing and taking into account the process and material dependency of gate-source voltage. Conventional design practice typically uses the experimentally-determined, "external" pinchoff voltage as the basis for design. This approach assumes that $V_{GS}=V_p$, when the extrapolated drain current $I_D=0$. This accords with the Schickman-Hodges ideal circuit model but, in practice, turns out to be inaccurate for some processes and materials, such as GaAsFETs and short-channel FETs. Therefore, as a further aspect of the invention, it is preferable to take these variations into account by determining what I define as an "internal" pinchoff voltage. This is done by measuring the external pinchoff voltage and using the measured value in the inequality $V_{DS} \geq V_{GS} - V_p$, to see if it correctly predicts operation in saturation (i.e., above the knee). This value of the pinchoff voltage does not work out for some materials and processes, e.g., GaAsFETs and short-channel FETs. Therefore, a different, "internal" pinchoff voltage $V_{\hat{p}}$ (sometimes referred to as $V_{to}$) is chosen to get the correct knee, as observed experimentally. Then, a constant $C_1$ is chosen so that the external pinchoff voltage is correct, i.e., $C_1 V_p = V_{\hat{p}}$. Constant $C_1$ is usually less than 1 for GaAsFETs and short-channel FETs.

Conventional design practice also typically ignores the effects of ohmic source resistance $R_S$ in the context of setting the operating point of a transistor. This is suitable for obtaining substantial equality within the tolerances set forth above. For greater accuracy, however, it may be desirable to take $R_S$ and $R_D$ in account and this can be done in a preferred embodiment of the invention.

The foregoing and other objects, features and advantages of the invention will become more readily apparent from the following detailed description of a preferred embodiment of the invention, and variations thereof, which proceeds with reference to the accompanying drawings.

DETAILED DESCRIPTION

The required $V_{DS}$ to keep a transistor in saturation, ignoring ohmic drain and source resistance, $R_D$ and $R_S$, is $$V_{DS} \geq |V_{to}| (I_D/I_{DSS})^{\frac{1}{2}}$$

So if $(I_D/I_{DSS})$ is constant, the required $V_{DS}$ to be in saturation is proportional to the magnitude of $V_{to}$ ($|V_{to}|$, hereinafter called $|V_{\hat{p}}|$), which is related to the pinchoff voltage $V_p$.

Figure 1:
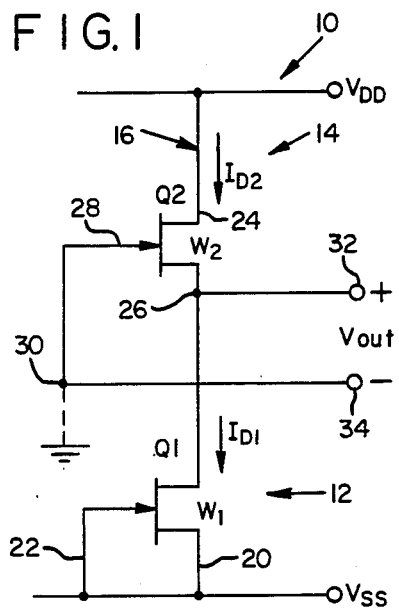
FIG. 1 is a schematic diagram of the simplest form of bias circuit for creating a voltage proportional to the pinchoff voltage in accordance with the invention.

Referring to FIG. 1, a biasing circuit 10 is designed in accordance with the invention to set $V_{DS}$ to be proportional to $|V_{to}|$. Such a biasing circuit automatically adjusts to the output bias voltage to accommodate process variations and temperature coefficient of $V_{DS}$.

Circuit 10 comprises a current source 12 and a reference subcircuit 14 connected in series in a current leg 16, coupled between two supply voltages, $V_{DD}$ and $V_{SS}$. The current source in this circuit is formed by a first depletion-mode field effect transistor Q1 having a source 20 and gate 22 connected to supply voltage $V_{SS}$. The reference subcircuit 14 is formed by a second depletion-mode field effect transistor Q2 having its drain 24 connected to supply volta $V_{DD}$ and its source connected to the drain of the first transistor Q1 at an output node 26. The second transistor Q2 has a gate 28, which can be coupled to ground or another reference voltage node 30 as appropriate to the design requirements of the circuit in which biasing circuit 10 is to be used. Bias circuit 10 produces an output voltage $V_{out}$ across terminals 32, 34 connected respectively to nodes 26, 30. Supply voltages $V_{DD}$ and $V_{SS}$ and the reference voltage at node 30 are selected to insure that FETs Q1 and Q2 are operated in the saturation region. How to do this will be understood by those skilled in the art.

Transistor Q1 has a gate width $W_1$ and transistor Q2 has a gate width $W_2$. These transistors are dimensioned, in accordance with the invention, to provide an output voltage $V_{out}$ that has a predetermined proportionality to the pinchoff voltage $V_p$ of the field effect transistors fabricated in the integrated circuit in which bias circuit 10 is used. More specifically, assuming the transistors have equal channel lengths in accordance with conventional FET integrated circuit design practice, the gate widths are proportioned so that the output voltage is proportional to a function of the ratio of the gate widths times the pinchoff voltage.

The output voltage $V_{out}$ of circuit 10 is equal to the source-gate voltage of transistor $Q_2$, that is, $V_{out} = -V_{GS2}$. The Schickman-Hodges ideal circuit model relates the gate-source voltage of a transistor to its drain current $I_D$ as follows, ignoring ohmic source resistance $R_S$:

$$I_D = (kW/L)(V_{GS} - V_p)^2 \qquad (1)$$

where
k is a material and process dependent constant;
W is the width of each FET;
L is the channel length of each FET;
$V_{GS}$ is the gate-source voltage across each FET.
Solving this equation for $V_{GS}$, it can be seen that:

$$V_{GS} = (I_D/(kW/L))^{\frac{1}{2}} + V_p \qquad (2)$$

and since $V_p$ is negative, $$V_{GS} = |V_p|((I_D/(kWV_p^2/L))^{\frac{1}{2}} - 1) \qquad (3)$$

Since the first transistor is coupled to form the current source 12, $$I_{D1} = I_{DSS1} \qquad (4)$$

where $I_{DSS1}$ is defined as the drain current of the FET when the gate-source voltage $V_{GS} = 0$.

Substituting this condition into the Schickman-Hodges equation for transistors Q1 and Q2 yields:

$$I_{DSS1} = (kW_1/L)V_p^2 \qquad (5)$$

$$I_{DSS2} = (kW_2/L)V_p^2 \qquad (6)$$

Taking the ratios of equations (5) and (6), assuming that the channel lengths of each of the transistors are equal, $$I_{DSS1}/I_{DSS2} = W_1/W_2 \quad (7)$$

Assuming that terminal 32 of the output voltage $V_{out}$ is connected to a high impedance, such as the gate of a subsequent stage as would be customary, the currents through the first and second transistors are substantially equal, that is, $$I_{D2} \approx I_{D1} = I_{DSS1} \quad (8)$$
$$= I_{DSS2}(W_1/W_2) \quad (9)$$

Substituting this relationship in equation (3) for transistor $Q_2$ yields:

$$V_{GS2} = |V_p|((I_{D2}/I_{DSS2})^{\frac{1}{2}} - 1) \quad (10)$$
$$= |V_p|((W_1/W_2)^{\frac{1}{2}} - 1) \quad (11)$$

From the foregoing relationship, it is apparent that $V_{out}$ can be specified as a fraction of the external pinchoff voltage $V_p$, with the proportionality function being substantially determined by the ratio of gate widths $W_1/W_2$ of transistors $Q_1$ and $Q_2$. This proportionality function likewise applies to the condition for operation in the saturation or high gain region, that is $$V_{DS} \geq V_{GS} - V_p \quad (12)$$
$$\geq [V_p](W_1/W_2)^{\frac{1}{2}}$$

Figure 2:
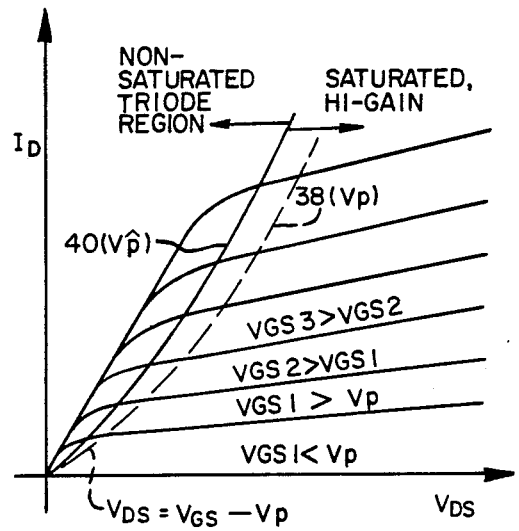
FIG. 2 is a drawing of an example of a curve tracer comparing external and internal pinchoff voltage.

The preceding analysis, based on the standard Schickman-Hodges ideal circuit model, does not fully take into account variations in materials and processes. For long-channel silicon JFETs and MOSFETs, it is reasonably accurate. For greater accuracy, particularly in short-channel GaAsFETs and silicon FETs, it is preferable to modify the model and preceding analysis. This is done by measuring the external pinchoff voltage $V_p$ of FETs fabricated by the particular technology in question. A typical external pinchoff voltage for a GaAsFET in an exemplary GaAsFET technology is $-1.6$ volts. This experimental value is used in the inequality $V_{DS} \geq V_{GS} - V_p$ and compared to the characteristic curves of the exemplary GaAsFET as observed on a curve tracer as illustrated in FIG. 2. It should correctly predict operation in the saturation region. For the external pinchoff voltage $V_p$, the equality $V_{DS} = V_{GS} - V_p$ defines a dashed curve 38 that does not, in fact, intercept the knee for short-channel GaAsFETs. Therefore, a different, "internal" pinchoff voltage $V_{\hat{p}}$ is selected to fit the correct knee, as defined by curve 40 in FIG. 2. In the exemplary GaAsFET technology, $V_{\hat{p}} = -0.9$ volts. Now, however, the internal pinchoff voltage incorrectly predicts the value of $V_{GS}$ that makes the extrapolated drain current equal to zero. So, a constant $C_1$ is chosen that corrects to the external pinchoff voltage $V_p$. In the exemplary GaAsFET technology $C_1 = 0.56$. These modifications are used to revise the Schickman-Hodges model, as follows, ignoring $R_S$:

$$I_D = (kW/L)(C_1 V_{GS} - V_{\hat{p}})^2 \quad (13)$$

From this last equation, the analysis of equations (1)–(11) can be restated for the exemplary GaAsFET technology, concluding as follows:

$$V_{GS2} = |V_{\hat{p}}|((I_{DS}/I_{DSS2})^{\frac{1}{2}} - 1)/C_1 \quad (14)$$
$$= |V_{\hat{p}}|((W_1/W_2)^{\frac{1}{2}} - 1)/C_1 \quad (15)$$

It can be seen from this revised analysis that the output voltage $V_{out}$ is somewhat different but, nonetheless, remains dependent upon pinchoff voltage, with a proportionality constant $C_2$ determined by a function of the ratio of the gate widths $W_1/W_2$. The drain-source voltage required for saturation likewise remains dependent on $V_{\hat{p}}$ and $I_D$. Equation 12 is restated from equation (15) as follows:

$$V_{DS} \geq V_{GS} - V_{\hat{p}} \quad (16)$$
$$\geq |V_{\hat{p}}|(C_2 + 1)$$
$$\geq |V_{\hat{p}}|(I_D/I_{DSS})^{\frac{1}{2}}$$

The foregoing analysis assumes that the channel lengths of the transistors are equal. For most common design situations, this is a reasonable assumption. The designer can more reliably control gate width than channel length. Also, for different channel lengths, $C_1$ may vary. Nevertheless, in some cases, it is possible to alter the proportionality constant by a ratio of channel lengths of the transistors, either as an alternative or in combination with the ratio of their gate widths.

In practice, it is preferable to fabricate the FETs $Q_1$ and $Q_2$ as an integral number of FETs of a nominal unit width, the unit-width FETs having their gates, sources and drains respectively coupled in parallel, e.g., so that $W_2 = n W_1$, where n is a rational number. This minimizes problems of fringe effects in determining the required ratio of gate widths. The designer is not unduly limited because most ratios of interest can be readily implemented as an integer fraction or multiple of a single unit gate width.

The foregoing analysis also assumes that ohmic source resistance $R_S$ and drain resistance $R_D$ equal zero. This assumption turns out not to affect the design in that the output voltage remains substantially equal to a predetermined constant times the pinchoff voltage. Greater accuracy can be obtained, however, by taking $R_S$ into account.

Figure 3:
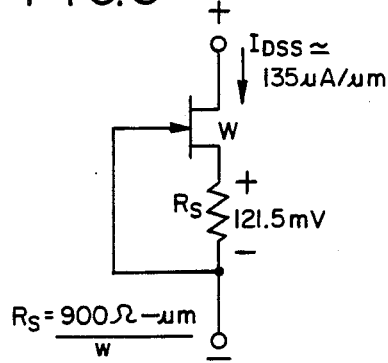
FIG. 3 is a diagram of a transistor model which takes into account ohmic source resistance.

Referring to the transistor model of FIG. 3, source resistance is determined experimentally, as a function of gate width, for a given FET technology. In the exemplary GaAsFET technology, $I_{DSS} = 135$ uA/um and the voltage drop is 121.5 mV, from which $R_S = 900$ ohm-um/W, where W is the gate width in meters.

$$I_{DSS} = I_{DSS0}(1 - (1.12 I_{DSS0} R_S)/V_{\hat{p}}) \quad (17)$$

where $I_{DSS0}$ is defined as $I_{DSS}$ when $R_S = 0$ and approximately equals 158 uA/um for the exemplary GaAsFET technology. For saturation $$V_{DS} \geq |V_{\hat{p}}|((I_D/I_{DSS0})^{\frac{1}{2}}) + 2 I_D R_S \quad (18)$$

where $R_S = R_D$. Since $R_S = 900$ ohm-um/W in the exemplary technology $$V_{DS} \geq |V_{\hat{p}}|((I_D/1.17 I_{DSS})^{\frac{1}{2}}) + 0.243 I_D/I_{DSS} \quad (19)$$

For $V_{\hat{p}} = -0.9$ V, equation (19) becomes:

$$V_{DS} \gtrsim |V_{\hat{p}}|((I_D/I_{DSS0})^{\frac{1}{2}} + 0.27\, I_D/I_{DSS}) \quad (20)$$

Figure 4:
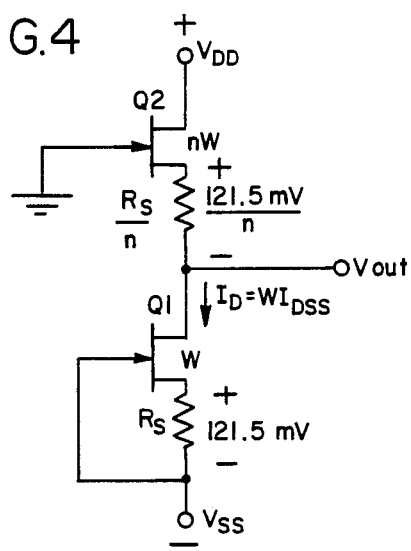
FIG. 4 is a transistor model of the circuit of FIG. 1 which takes into account ohmic resistance.

Referring next to FIG. 4, the analysis is extended to the circuit of FIG. 1 as follows:

$$V_{out} = -V_{GS} = 1.786\, |V_{\hat{p}}|(1-(1/1.17n)^{\frac{1}{2}}) - 121.5 \text{ mV/n} \quad (21)$$

Dividing this equation through by $|V_{\hat{p}}|$ yields $$-V_{GS}/|V_{\hat{p}}| = 1.786\,(1-(1/1.17n)^{\frac{1}{2}}) - 121.5 \text{ mV/n}|V_{\hat{p}}| \quad (22)$$

This quantity is tabulated as follows for various values of n:

| n = | 2 | 3 | 4 | 5 | 6 | 7 | 8 | 9 |
|---|---|---|---|---|---|---|---|---|
| | .551 | .788 | .927 | 1.021 | 1.089 | 1.143 | 1.185 | 1.221 |
| n = | 10 | 15 | 20 | | | | | |
| | 1.250 | 1.351 | 1.410 | | | | | |

It is apparent that increase in n, i.e., increases in the ratio of gate widths $W_1/W_2$, yield diminishing returns in the proportionality factor in the circuit 10 of FIG. 1.

Figure 5:
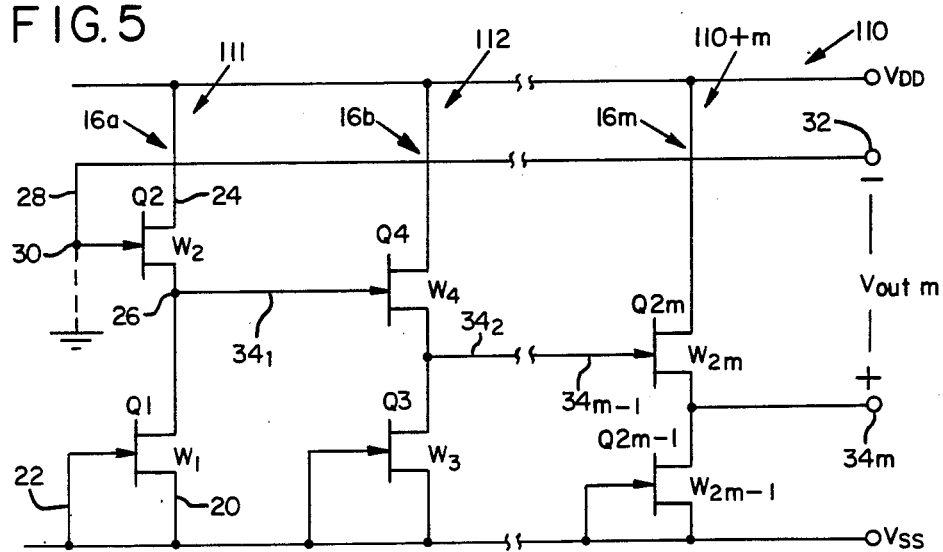
FIG. 5 is a schematic diagram of a biasing circuit in which two or more stages of the circuit of FIG. 1 are cascaded to provide greater multiples of the pinchoff voltage.

FIG. 5 shows how to cascade the biasing circuit in circuit 110 in accordance with the invention to obtain greater multiples of pinchoff voltage. The first stage 111 is the same as circuit 10 and its elements are identified by like reference numerals. The output voltage $V_{out}$ of the first stage is input to the second stage 112 via conductor $34_1$, where 1 indicates the number of the stage. The second stage and successive stages have the same form as the first stage. The output voltage of the second stage is input via conductor $34_2$ to the third stage (not shown). This is repeated through stage m, which has an output terminal $34_m$ having a bias voltage $V_{outm}$ relative to terminal 32.

The final output voltage $V_{outm}$ is the sum of the gate-source voltage of the reference subcircuits of each stage:

$$V_{outm} = -V_{GS2} - V_{GS4} \ldots - V_{GS(2m)} \quad (23)$$

From equation (15), for two stages, this extends to $$V_{out2} = (|V_{\hat{p}}|/C_1)((W_1/W_2)^{\frac{1}{2}} + (W_3/W_4)^{\frac{1}{2}} - 2) \quad (24)$$

and generalizes to $$V_{outm} = (|V_{\hat{p}}|/C_1)\left(\sum_{i=1}^{m}(W_{2i-1}/W_{2i})^{\frac{1}{2}} - m\right)$$

Figure 6:
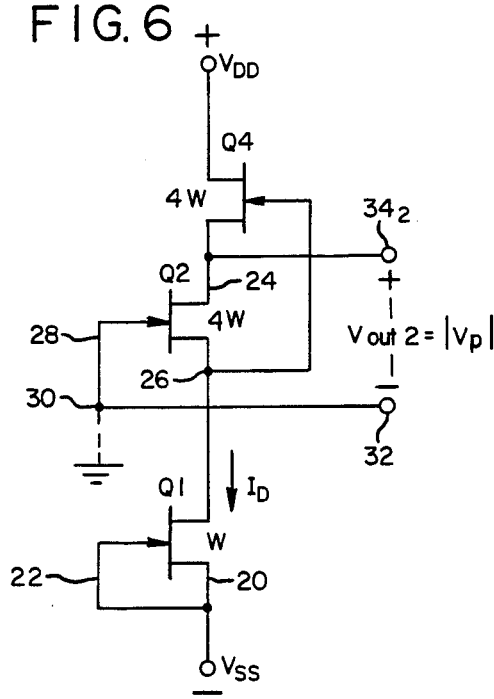
FIG. 6 is a drawing of a special case of the circuit of FIG. 5 that uses three transistors to provide two stages.

Referring next to FIG. 6, in a special case a two stage version of the circuit of FIG. 5 can be reduced to three transistors. The general condition for the special case is that $W_2$ and $W_3$ be sufficiently large that all transistors are saturated. This condition is met but not restricted to the case when $W_1 = W_3$ and $W_2 = W_4 = 4W_1$. Comparing FIG. 6 to the first two stages of FIG. 5, transistor Q3 is omitted and the drain of transistor Q2 is disconnected from $V_{DD}$ and connected to the source of transistor Q4. Using equation (24), the gate width $W_1$ is substituted for $W_3$, as follows:

$$V_{out2} = (|V_{\hat{p}}|/C_1)((W_1/W_2)^{\frac{1}{2}} + (W_1/W_4)^{\frac{1}{2}} - 2) \quad (25)$$

In the case where $(W_1/W_2) = (W_1/W_4) = \frac{1}{4}$, equation (25) reduces to $V_{out2} = (|V_{\hat{p}}|/C_1)$. In other words, in this specific case the output voltage is equal to the external pinchoff voltage. An added benefit of this circuit is that transistor Q4 cascodes transistor Q2.

Figure 7:
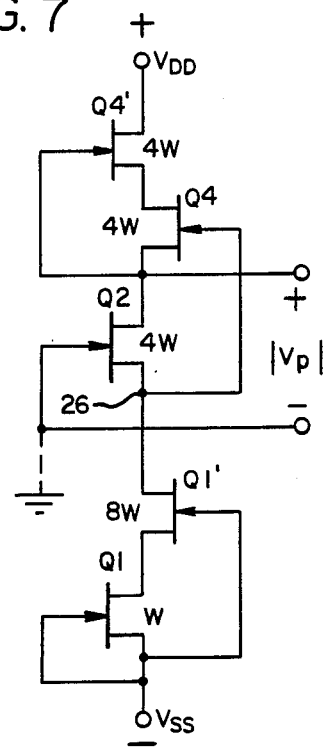
FIG. 7 is a schematic diagram of a cascoded version of the circuit of FIG. 6.

FIG. 7 shows an enhanced version of the circuit of FIG. 6 in which transistors Q1 and Q4 are cascoded. A transistor Q1' is connected between the drain of transistor Q1 and the source of transistor Q2, and has its gate connected to the source of transistor Q1. A transistor Q4' is similarly connected between the drain of transistor Q4 and supply voltage $V_{DD}$. The cascode transistors in this circuit have a gate width sufficient to keep the cascoded transistors in saturation. This circuit provides substantially the same biasing voltage as that of FIG. 6, but is less susceptible to variations in supply voltage and reduces the circuit's dependence on channel length modulation.

Figure 8:
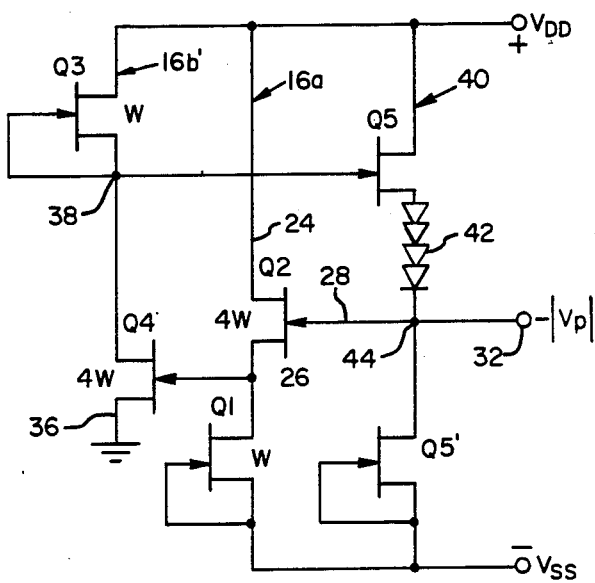
FIG. 8 is a schematic diagram of a version of the circuit of FIG. 6 modified to include a buffer amplifier and to produce a negative pinchoff voltage.

FIG. 8 shows an alternate arrangement of a two stage biasing circuit that includes a buffer amplifier for driving a load and produces a negative $V_{out2}$. In this circuit, the current leg 16a and its elements are the same as those used in FIGS. 1 and 5. The second stage current leg 16b' is rearranged from that shown in FIG. 5, with the source 36 of transistor Q4 connected to ground and transistor Q3 connected between the drain of transistor Q4 and supply voltage $V_{DD}$. The gate and source of transistor Q3 are coupled at node 38 to form a current source, as previously discussed, and connected to the drain of transistor Q4. This node is also connected to the gate of a buffer amplifier transistor Q5 connected in a current leg 40 between the two supply voltages. Transistor Q5 has its drain connected to voltage $V_{DD}$ and its source coupled through a string of Schottky diodes 42 (typically four or more depending on the value of $V_{DD}$ and $V_p$) to an output node 44. This node is connected to the gate 28 of transistor Q2 and to output terminal 32. It is also connected to the drain of a transistor Q5'. Transistor Q5' has its source and gate coupled to supply voltage $V_{SS}$ to form a current source for buffer amplifier transistor Q5. Transistors Q3 and Q4 additionally form a high-gain amplifier. Using the same gate width ratios described above for the circuits of FIGS. 6 and 7, this circuit produces a $V_{out} \cong |V_p|$ and can drive a low impedance load.

Figure 9:
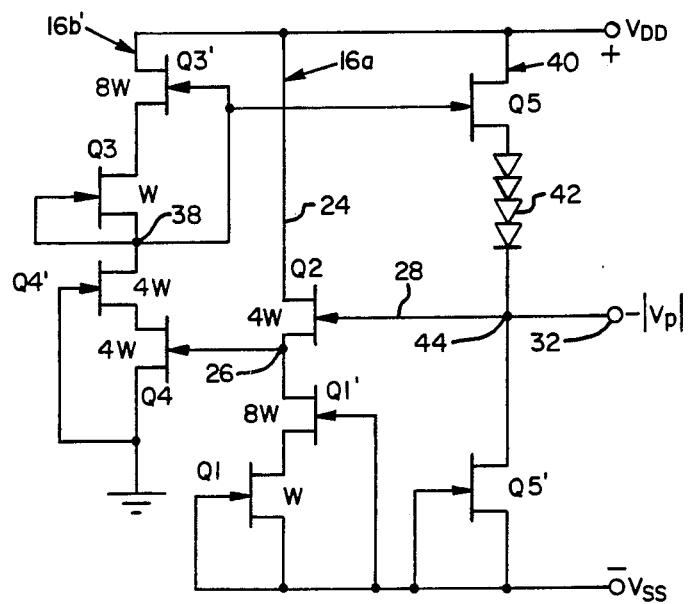
FIG. 9 is a schematic diagram of a cascoded version of the circuit of FIG. 8.

FIG. 9 shows a cascoded version of the circuit of FIG. 8. Current leg 40 containing the buffer amplifier is unchanged. Current-source transistor Q1 has a cascoded transistor Q1' connected between its drain and transistor Q2. Current-source transistor Q3 similarly has a cascode transistor Q3' connected between its drain and supply voltage $V_{DD}$. Additionally, transistor Q4 has a cascode transistor Q4' with its gate connected to the source of transistor Q4. In this circuit, the gate width ratios for transistors Q1, Q2, Q3 and Q4 are shown as the same as those of FIGS. 6, 7 and 8, to produce a $V_{out} = -|V_p|$ that can drive a low impedance load. The width of the cascode transistors Q1' and Q3', however, is increased by a ratio of 8:1 to insure that $V_{DS}$ is large enough to keep the current-source FETs in saturation. My prior patent application Ser. No. 002,082 shows, in FIG. 7, a pinchoff voltage generator similar in principle to that of FIG. 9, designed to produce a bias voltage of 2.3 $|V_{\hat{p}}|$ (referred to therein as 2.3 $|V_{to}|$ for biasing a level shifter.

Having illustrated and described the principles of my invention in a preferred embodiment and several variations thereof, it should be readily apparent to those skilled in the art that the invention can be modified in arrangement and detail without departing from such principles. For example, multiple stages such as shown in FIG. 5 could be used for stage 16a in the circuit of FIG. 8. I claim all modifications coming within the spirit and scope of the accompanying claims.

I claim:

1. In an integrated circuit, a pinchoff voltage generator comprising:
   a first depletion-mode FET having a drain connected to an output node, a source connected to a first supply voltage and a gate connected to the source to operate as a current source having a first current equal to $I_{DSS}$ of the first FET, wherein $I_{DSS}$ is defined as $I_D$ under the condition that the gate-source voltage $V_{GS}$ is zero;
   a second depletion-mode FET having a gate, a drain connected to a second supply voltage, and a source connected to the drain of the first FET at the output node;
   first bias means for operating the first and second FETs in saturation; and
   second bias means comprising a reference voltage coupled to bias the gate of the second FET such that, in operation, a second current flows through the second FET that is not greater than $I_{DSS}$ of the second FET and is substantially equal to the current through the first FET ($I_{D2} \cong I_{D1} \cong I_{DSS1} \geq I_{DSS2}$);
   the first and second FETs having first and second gate widths ($W_1$, $W_2$), respectively, proportioned to $I_{DSS}$ of each of the first and second FETs so that an output voltage is provided at the output node which has a magnitude referenced to the gate of the second FET that is substantially equal to a predetermined constant times the magnitude of the pinchoff voltage of the FETs ($V_{GS2} = C_2|V_p|$).

2. An integrated circuit according to claim 1 in which the output voltage is input to a high impedance load.

3. An integrated circuit according to claim 1 in which the FETs have equal channel lengths and the gate widths are proportioned such that $$I_{DSS1}/I_{DSS2} = W_1/W_2 = I_{D2I}/I_{DSS2}$$

whereby the output voltage is substantially defined by $$V_{GS2} = |V_p|((W_1/W_2)^{\frac{1}{2}} - 1)$$

4. An integrated circuit according to claim 1 including at least two stages each comprising said first and second FETs, the output voltage of the second FET in the first stage being connected to the gate of the second transistor of the second stage, so that the second stage has an output voltage proportional to the pinchoff voltage times a sum comprising functions of the ratios of gate widths of each stage.

5. An integrated circuit according to claim 4 in which the FETs have equal channel lengths and the gate widths are proportioned such that $$I_{DSS1}/I_{DSS2} = W_1/W_2 = I_{D2}/I_{DSS2}$$

whereby the output voltage is substantially defined by $$V_{outm} = |V_p| \left( \sum_{i=1}^{m} ((W_{2i-1}/W_{2i})^{\frac{1}{2}}) - m \right)$$

where m is the number of stages.

6. An integrated circuit according to claim 1 in which the magnitude of the output voltage includes a constant subtractive from the pinchoff voltage and is proportional to an ohmic source resistance voltage drop internal to the second FET.

7. An integrated circuit according to claim 6 in which the ohmic source resistance voltage drop is inversely proportional to the ratio of the gate width of the second FET over the gate width of the first FET.

8. An integrated circuit according to claim 1 in which the first FET includes a cascode FET connected between the drain of the first FET and the source of the second FET and having a gate connected to the source of the first FET.

9. An integrated circuit according to claim 8 in which the cascode FET has gate width that is sufficiently greater than the gate width of the first FET to operate the first FET in saturation.

10. An integrated circuit according to claim 1 in which the second FET includes a cascode FET connected between the drain of the second FET and the second supply voltage and having a gate connected to the source of the second FET.

11. An integrated circuit according to claim 8 in which the cascode FET has gate width that is sufficiently greater than the gate width of the second FET to operate the second FET in saturation.

12. An integrated circuit according to claim 1 in which the first FET includes a cascode FET connected between the drain of the first FET and the source of the second FET and having a gate connected to the source of the first FET; and
   in which the second FET includes a cascode FET connected between the drain of the second FET and the second supply voltage and having a gate connected to the source of the second FET.

13. An integrated circuit according to claim 1 in which the first FET and second FET each have gate widths that are different integer multiples of a predetermined unit gate width.

14. An integrated circuit according to claim 1 including a third depletion-mode FET connected between the drain of the second FET and the second supply voltage, the source of the second FET being connected to the gate of the third FET and the widths of the second and third FETs being sufficiently large that all of the first, second and third transistors operate in saturation, so that the output voltage at an output node in the source of the third transistor is proportional to the pinchoff voltage.

15. An integrated circuit according to claim 11 in which the second and third transistors have equal widths.

16. An integrated circuit according to claim 14 in which the first and third transistors each include a cascode transistor.

17. An integrated circuit according to claim 14 in which each cascode transistor has a width sufficient to operate the first and third transistors in saturation.

18. An integrated circuit according to claim 1 including a buffer amplifier having a high impedance input connected to the output node of the second transistor.

19. An integrated circuit according to claim 1 including a third depletion-mode FET having a drain connected to the second voltage supply and a gate connected to its source to form a current source, and a fourth depletion-mode FET having a drain connected to the source of the third FET, a source coupled to a second said reference voltage, and a gate connected to the output node of the second FET, the source of the third FET that being coupled to the gate of the second FET so that an output voltage is provided at the gate of the second FET with respect to the source of the fourth FET is proportional to a negative of the magnitude of the pinchoff voltage.

20. An integrated circuit according to claim 19 including buffer amplifier means having a high impedance input connected to the source of the third FET and a low impedance output means for driving a load with said negative output voltage.

21. An integrated circuit according to claim 19 in which the first and third transistors each include a cascode transistor.

22. An integrated circuit according to claim 21 in which each cascode transistor has a width sufficient to operate the first and third transistors in saturation.

23. In an integrated circuit, a method for generating a reference voltage proportional to the pinchoff voltage of a FET, comprising:
   providing first and second depletion-mode FETs, each having a gate, a source and a drain;
   connecting the source and gate of the first FET to a first supply voltage to form a current source having a first current $I_{D1}$ equal to $I_{DSS}$ of the first FET;
   connecting the drain of the second FET to a second supply voltage and the source of the second FET to the drain of the first FET at an output node to form a current path for a second current $I_{D2}$ through the second FET substantially equal to the first current and not greater than $I_{DSS}$ of the second FET ($I_{D2} \cong I_{D1} \cong I_{DSS1} < I_{DSS2}$);
   biasing the first and second FETs to operate in saturation; and
   forming the first and second FETs with first and second gate widths sized in proportion to the ratios of each $I_{DSS}$ ($I_{DSS1}/I_{DSS2} = W_1/W_2 = I_{D2}/I_{DSS2}$), thereby generating said reference voltage between the output node and the gate of the second FET.

24. An integrated circuit according to claim 20 including forming the first and second FETs with equal channel lengths and sizing the gate widths such that ($I_{DSS1}/I_{DSS2} = W_1/W_2 = I_{D2}/I_{DSS2}$)

25. A method of designing a reference voltage for an integrated circuit, comprising:
   providing a current source, including a first depletion-mode FET having a source, coupled to a first supply voltage for establishing a first current flow equal to IDSS of the first FET ($I_{D1} = I_{DSS1}$);
   providing a second depletion-mode FET having a gate, a drain connected to a second supply voltage, and a source connected to the drain of the first FET at an output node so that, in operation, a second current flows through the second FET that is equal to the current through the first FET and is not greater than $I_{DSS}$ of the second FET ($I_{D2} = I_{D1} = I_{DSS1} < I_{DSS2}$);
   determining an external pinchoff voltage $V_p$ of the FETs; and
   proportioning the dimensions of each of the FETs such that the gate to source voltage across the second FET equals a constant times the internal pinchoff voltage $V(V_{GS2} = C_2 |V_{\hat{p}}|)$.

26. A method according to claim 25 in which the dimension of the FETs are proportioned substantially in accordance with the equation $$I_D = (kW/L)(C_1 V_{GS} - V_{\hat{p}})^2,$$

where
   k is a material and process dependant constant;
   W is the width of each FET;
   L is the channel length of each FET;
   $V_{GS}$ is the gate-source voltage across each FET;
   $V_{\hat{p}}$ is an internal pinchoff voltage that substantially defines a transition of operation of each FET between nonsaturated ($V_{DS} \leq V_{GS} - V_{\hat{p}}$) and saturated ($V_{DS} \geq V_{GS} - V_{\hat{p}}$) operation; and
   $C_1$ is a constant, defined for the particular process used to fabricate the integrated circuit for the condition in which the extrapolated value of $I_D = 0$ for said external pinchoff voltage, for scaling the internal pinchoff voltage ($V_{\hat{p}}$) to the external pinchoff voltage $V_p$.

* * * * *